United States Patent
Naudet

(10) Patent No.: US 6,377,644 B1
(45) Date of Patent: Apr. 23, 2002

(54) PERIODIC SIGNAL DIGITAL TESTING

(75) Inventor: Hervé Naudet, Meylan (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/264,107

(22) Filed: Mar. 8, 1999

(30) Foreign Application Priority Data

Mar. 9, 1998 (FR) .......................................... 98 03082

(51) Int. Cl.$^7$ .......................... H04B 17/00; H04B 3/46; H04Q 1/20
(52) U.S. Cl. ........................................ 375/371; 375/371
(58) Field of Search ................. 375/371, 373, 375/376, 226

(56) References Cited

U.S. PATENT DOCUMENTS

| | | | |
|---|---|---|---|
| 4,876,655 A | 10/1989 | Carlton et al. | 364/487 |
| 4,928,251 A | 5/1990 | Marzalek et al. | 364/484 |
| 4,975,634 A | 12/1990 | Shohet | 324/83 R |
| 4,994,991 A | 2/1991 | Richman | 364/581 |
| 5,440,592 A | 8/1995 | Ellis et al. | 375/354 |
| 5,481,563 A | 1/1996 | Hamre | 375/226 |
| 5,793,822 A | * 8/1998 | Anderson et al. | 375/371 |
| 5,923,706 A | * 7/1999 | Marz | 375/226 |
| 6,240,130 B1 | * 5/2001 | Burns et al. | 375/226 |
| 6,295,315 B1 | * 9/2001 | Frisch et al. | 375/226 |

FOREIGN PATENT DOCUMENTS

| | | | |
|---|---|---|---|
| EP | A-0 309 921 | 4/1989 | G01R/23/02 |
| EP | A-0 773 447 | 5/1997 | G01R/29/02 |

* cited by examiner

*Primary Examiner*—Chi Pham
*Assistant Examiner*—Phuong Phu
(74) *Attorney, Agent, or Firm*—Wolf, Greenfield & Sacks, P.C.; James H. Morris

(57) ABSTRACT

The present invention relates to a method for determining a characteristic of a periodic digital signal, including the steps of: defining a measurement period such that the ratio between the measurement period and the period of the digital signal is a ratio of integers; selecting a set of measurement periods in which the digital signal has substantially the same phase; defining a measurement time having a same position in each measurement period of the set; storing the value of the digital signal at each measurement time; shifting the measurement time by a predetermined pitch lower than one measurement period; repeating the two preceding steps until the measurement time of each measurement period has scanned a predetermined portion of the measurement period; and analyzing the succession of the noted values.

3 Claims, 7 Drawing Sheets

PERIODIC SIGNAL DIGITAL TESTING

BACKGROUND OF THE INVENTION

1. Field of the Invention

The present invention relates to the field of the measurement of characteristics of a periodic digital signal and more specifically the measurement of the frequency and the jitter of a periodic digital signal with a digital measurement device.

2. Discussion of the Related Art

Many electronic circuits integrate periodic digital signal generation devices such as a phaselocked loop (PLL). Such periodic digital signal generation devices have to be tested to guarantee proper circuit operation.

In particular, it is necessary to measure the frequency and the jitter of the generated periodic digital signal to check that they are not outside guaranteed operating ranges.

Many devices enabling such a testing are available for sale. Conventionally, a dedicated time measurement unit (TMU) added to a conventional digital testing device is used.

FIG. 1 shows as an example the principle of the measurements performed by a TMU. Sin designates a periodic digital signal, the frequency and the jitter of which are desired to be measured, CK designates an internal clock signal of the TMU, t1 and t2 designate the contents of two counters incremented by clock CK, the counting of which is respectively triggered by a rising edge and a falling edge of signal Sin and is respectively reset by the falling and rising edges of signal Sin.

Once contents t1 and t2 are known, a calculator determines the frequency of signal Sin by calculating the inverse of t1+t2. Similarly, the TMU can perform a great number of measurements of value t2, and stores in a table the number of occurrences of each value measured for t2. Using this table a curve may be plotted representing the time distribution law of the rising edge of signal Sin, and a calculator deduces therefrom value a corresponding to the standard deviation of this distribution law, that is, the jitter of signal Sin.

A disadvantage of this method is that it requires a clock signal CK having a high frequency, generated by an expensive specific device. With technological developments resulting in a frequent use of devices such as PLLs generating periodic digital signals of increasing frequency, the state of the art will result in the use of TMUs operating at increasing frequencies and of an increasing cost.

SUMMARY OF THE INVENTION

An object of the present invention is to allow measuring the frequency and the jitter of a periodic digital signal without using a TMU.

Another object of the present invention is to provide a device allowing the measurement of the frequency and the jitter of a periodic digital signal, which can be integrated on the circuit which contains the periodic digital signal generation circuit.

To achieve these and other objects, the present invention provides a method for determining a characteristic of a periodic digital signal, including the steps of:

defining a measurement period such that the ratio between the measurement period and the period of the digital signal is a ratio of integers;

selecting a set of measurement periods in which the digital signal substantially has the same phase;

defining a measurement time having a same position in each measurement period of the set;

storing the value of the digital signal at each measurement time;

shifting the measurement time by a predetermined pitch smaller than one measurement period;

repeating the two preceding steps until the measurement time of each measurement period has scanned a predetermined portion of the measurement period; and analyzing the succession of the stored values.

According to an embodiment of the present invention, the characteristic is the frequency of the digital signal;

the ratio between the measurement period and the period of the digital signal is an integer;

the predetermined portion of the measurement period is the entire measurement period; and the analysis includes comparing the stored values with an expected value, storing in a table the number of inequations resulting from these comparisons for each position of a measurement time, and using the image of the digital signal provided by this table to calculate the period of the digital signal.

According to an embodiment of the present invention, the characteristic is the jitter of the digital signal;

the predetermined period portion is in a vicinity of an edge of the digital signal; and the analysis includes comparing the noted values with an expected value, storing in a table the number of inequations resulting from these comparisons for each position of a measurement time, calculating the time derivative of the succession of numbers contained in this table, and using this derivative to calculate the jitter of the digital signal.

According to another aspect of the present invention, a method is provided for determining the frequency of a periodic digital signal, including the steps of defining a measurement period such that the ratio between the measurement period and the period of the digital signal is a non integer ratio of integers;

defining a measurement time having a same position in each period of a set of consecutive measurement periods;

storing the value of the digital signal at each measurement time; and performing on the stored values a reverse Fourier transform.

According to another aspect of the present invention, a device is provided for determining a characteristic of a periodic digital signal, including means for defining a measurement period such that the ratio between the measurement period and the period of the digital signal is a ratio of integers;

means for selecting a set of measurement periods in which the digital signal has substantially the same phase;

means for defining a measurement time having a same position in each measurement period of the set;

means for storing the value of the digital signal at each measurement time;

means for shifting the measurement time by a predetermined pitch smaller than one measurement period;

means for repeating the two preceding steps until the measurement time of each measurement period has scanned a predetermined portion of the measurement period; and means for analyzing the succession of the stored values.

DETAILED DESCRIPTION

The present invention uses in an original way, a conventional digital tester, having no time measurement unit (TMU), to measure the frequency or the jitter of a periodic digital signal Sin.

A conventional digital tester is synchronized on a measurement clock CK, defining a measurement period T. It performs one or two recordings or samplings of the state of the measured signal at adjustable measurement times within a same period T. It further compares each obtained sample with an expected value, and stores the result of the comparisons in a memory or communicates them to a calculator.

The ratio of period T and of the period of signal Sin must be equal to a ratio of integers to enable an analysis of signal Sin by a tester. For this purpose, clock CK is generally used as a stimulus for the circuit generating signal Sin. A remarkable advantage of this method is that the measurement frequency of clock CK of the tester can be substantially smaller than the frequency of analyzed signal Sin, and thus enable the use of a tester of limited cost.

Figure 1:
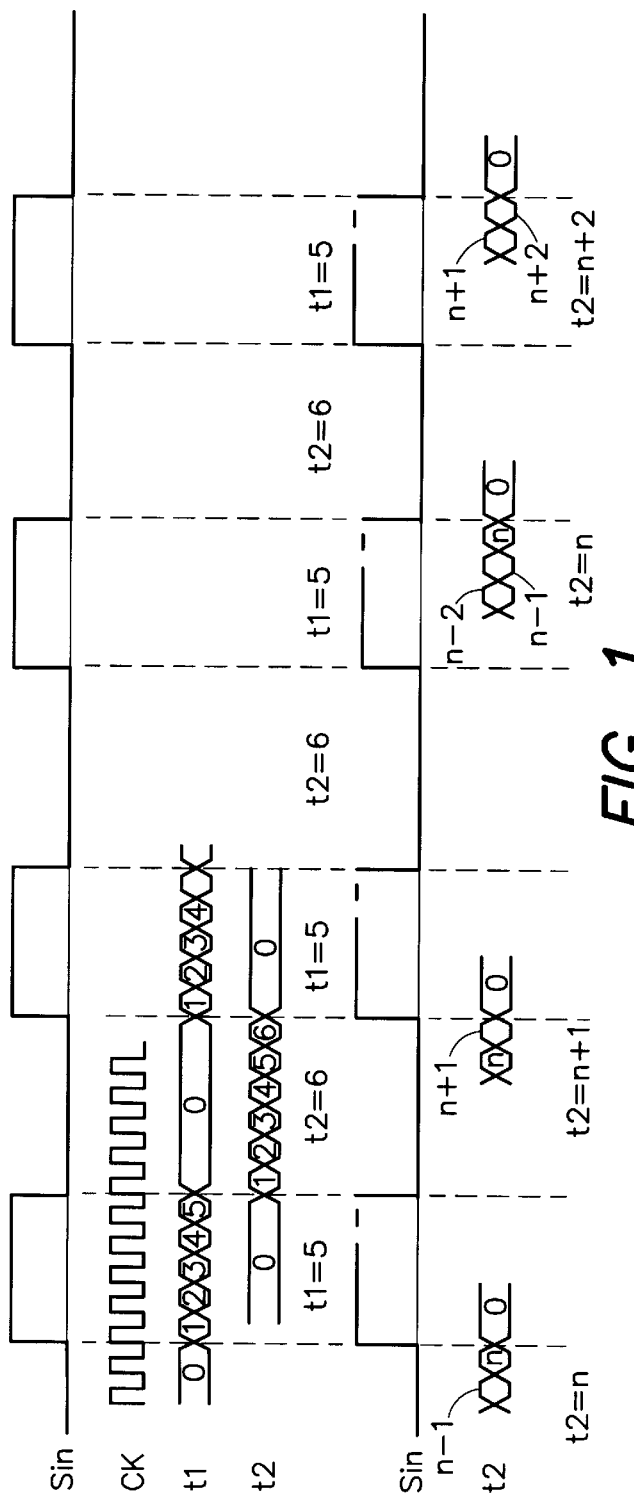
FIG. 1 illustrates a conventional method of calculation of the frequency and of the jitter of a periodic digital signal.
Figure 2:
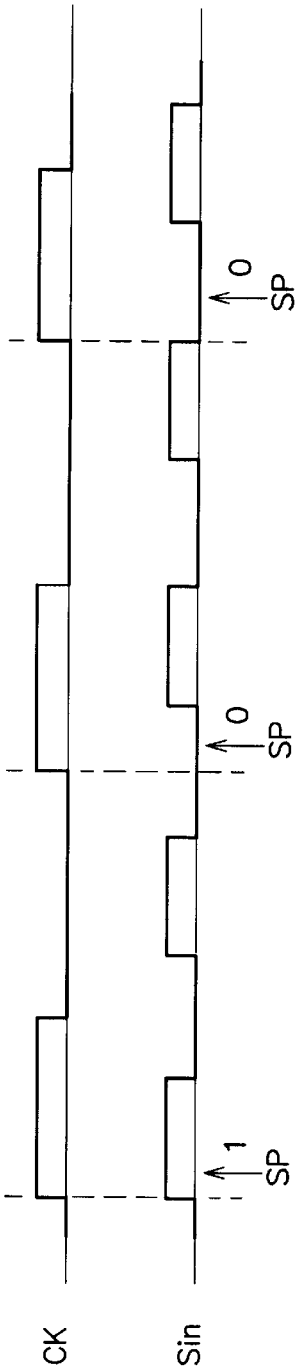
FIG. 2 illustrates a method of measurement of the frequency of a periodic digital signal according to the present invention.

FIG. 2 shows a periodic digital signal Sin, the frequency f(Sin) of which is desired to be measured. Signal Sin of FIG. 2 is such that the ratio of its period and of measurement period T of clock signal CK is equal to a non integer ratio of two integers.

SP designates a time of measurement of the value of signal Sin, such that each time SP is at a same position in a corresponding measurement period T.

According to the present invention, a number N of samplings of the value of signal Sin at times SP of a number N of successive periods T is performed. In the example of FIG. 2, the first obtained sample is equal to 1. The phase of signal Sin changes in the following period T, so that the second obtained sample is equal to 0. The first obtained samples, in this example, at times SP, are equal to 1, 0, 0 . . . It should be noted that, due to the existing ratio between the two periods, a same phase is periodically found between signal Sin and measurement period T. Thus, the obtained samples form a periodic sequence of ones and zeros.

This periodic sequence is transmitted to a calculator, generally associated with a conventional digital tester, which calculates its discreet Fourier transform, and which especially calculates the frequency Fmax corresponding to the maximum amplitude of this transform.

If the measurement period T, which determines the sampling frequency, fulfills Shannon's theorem with respect to frequency f(Sin) of the signal to be analyzed, then frequency f(Sin) is equal, with a precision equal to ±F/N, where F=1/T, to frequency Fmax.

It should be noted that if sampling frequency F does not fulfill Shannon's theorem, that is, it is smaller than twice Fmax, frequency f(Sin) will be equal to K.F-Fmax±F/N if K is even or to K.Fmax±F/N if K is odd.

If it is desired to increase the accuracy of the measurement, it is enough to increase the number N of samples used for the calculation.

It should however be noted that such a method can only be used when the period of one of signals CK and Sin is not equal to an integer number of periods of the other signal. In the opposite case, no phase difference appears between signal Sin and measurement period T, the sampled value would be constant, and the sequence of samples would be impossible to use according to this method.

Figure 3A:
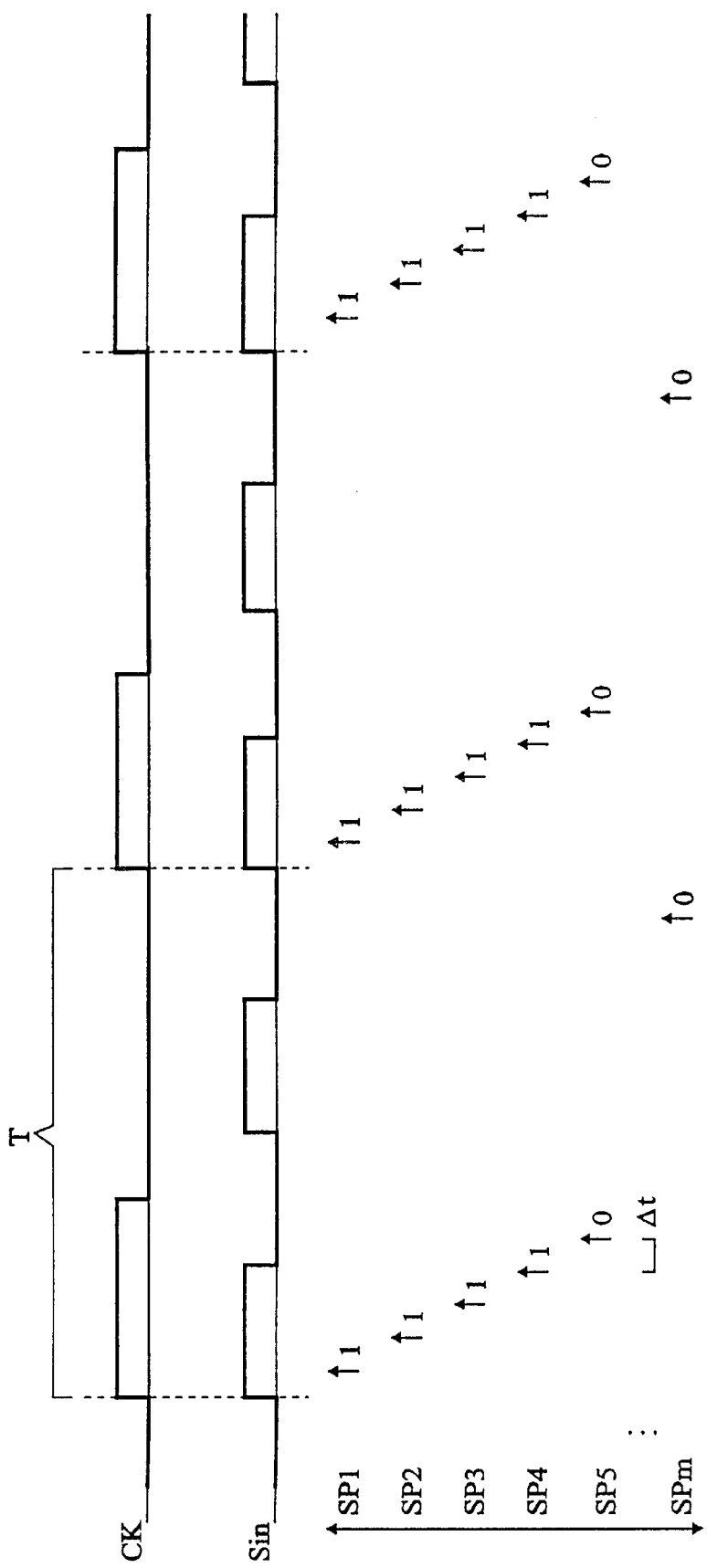
FIG. 3A illustrates a method of measurement of the frequency of a specific periodic digital signal according to the present invention.

FIG. 3A illustrates a method according to the present invention for measuring the frequency of a periodic digital signal Sin when the measurement period T of the digital tester is equal to an integer number of periods of signal Sin.

A first sampling time SP 1 is determined, such that this time is close to the beginning of each measurement period T. N samplings of signal Sin are then performed in N consecutive measurement periods. Each of the sampled values is compared with an expected value, for example, 0, and the number of inequations or errors is measured. In FIG. 3A, time SP 1 is such that the tester measures N times a value 1, which corresponds to N errors with respect to the expected value 0.

Once the first series of measurements is over, a new measurement time SP2, distant from time SP1 by a pitch Δt, which is small with respect to a measurement period T is used. N measurements of the value of signal Sin are performed again in N consecutive measurement periods. In FIG. 3A, time SP2 is such that N errors with respect to the expected value 0 are stored again.

This step is repeated for measurement times SP3, SP4 . . . SPm, where m is chosen such that mΔt is substantially equal to T. As an example, m=50 could be chosen.

Once a series of N measurements has been performed, a table of m values is available. These values, each corresponding to the number of errors for a measurement time, form an image of the evolution of signal Sin to be analyzed in a measurement period T. A calculator determines from the transitions present in this table the frequency f(Sin) searched. Calling d the distance between two transitions of same direction, f(Sin)=1/d.

Figure 3B:
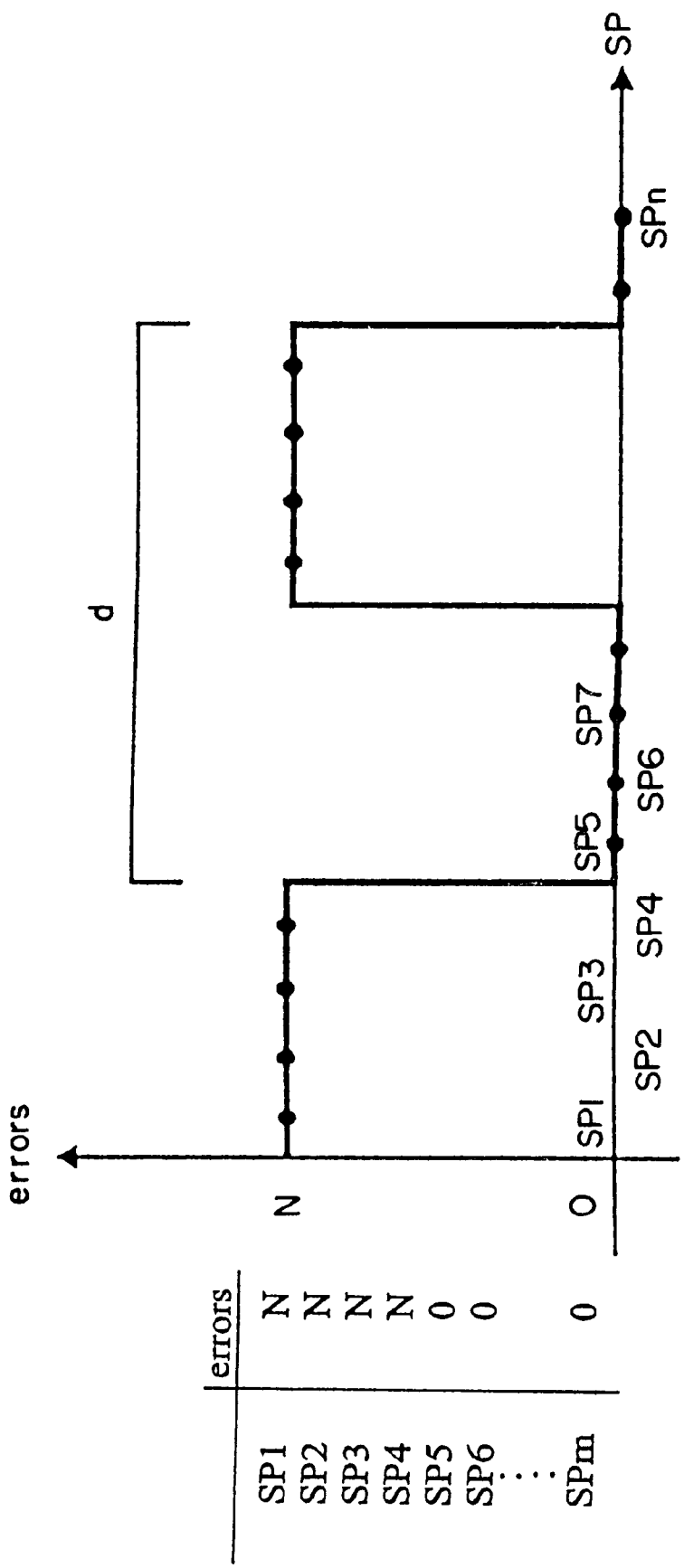
FIG. 3B shows curves obtained with the method illustrated in FIG. 3A.

FIG. 3B shows an example of a table of error numbers and the corresponding image of signal Sin.

Figure 4A:
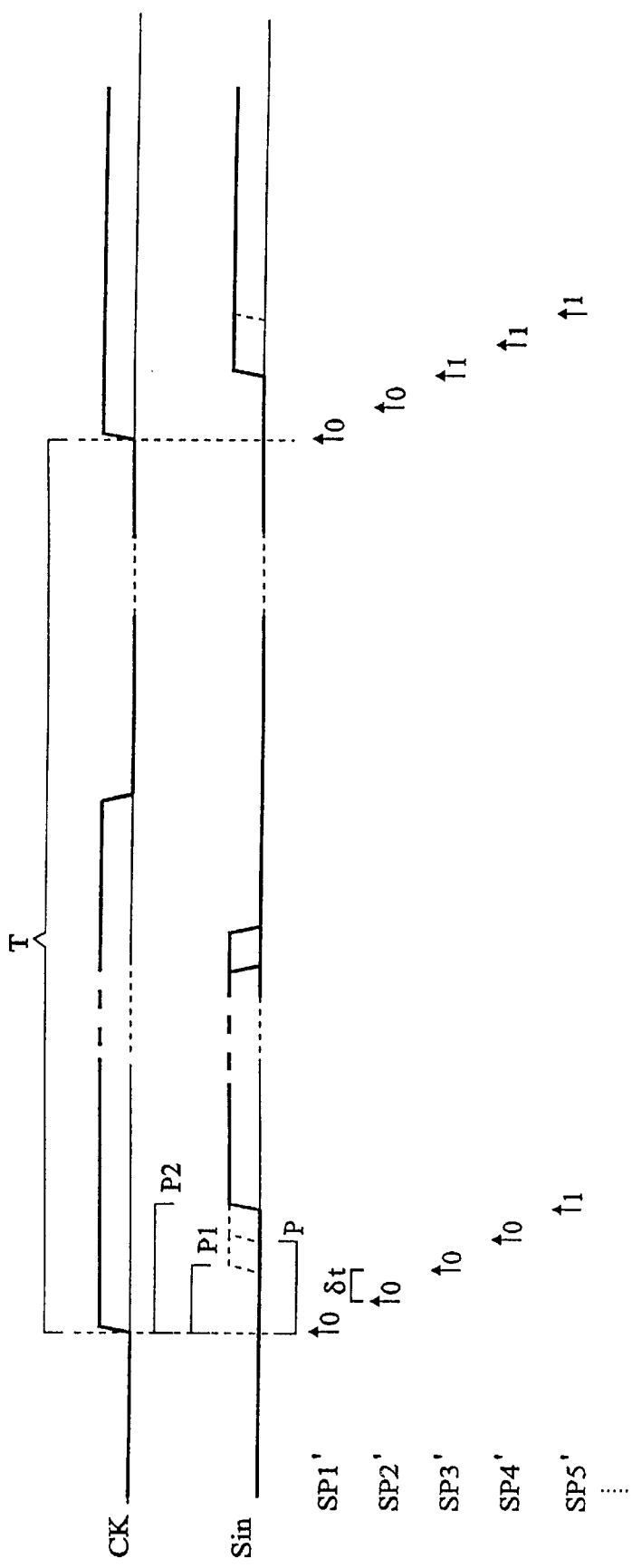
FIG. 4A illustrates a method of measurement of the jitter of a specific periodic digital signal according to the present invention.

FIG. 4A illustrates a method according to the present invention for measuring the jitter of a periodic digital signal Sin when measurement period T of the digital tester is equal to an integer number of periods of signal Sin.

The position P of an edge of signal Sin to be analyzed is first determined by a sampling such as that described in relation with FIG. 3A in measurement period T. Position P is then known with an accuracy equal to plus or minus the time pitch Δt mentioned in relation with FIG. 3A.

The jitter of signal Sin is assumed to vary the position of the considered edge around its nominal position P between two positions P1 and P2. Each of intervals P2-P and P-P1 is generally small with respect to above-mentioned time pitch Δt. According to the present invention, m measurement times SP1' to SPm' such that P-SP1'=Δt, SPm'-P=Δt, and such that two successive measurement times are separated by a time pitch δt, are defined for the jitter measurement. Thus, (m−1) δt=2Δt.

Figure 4B:
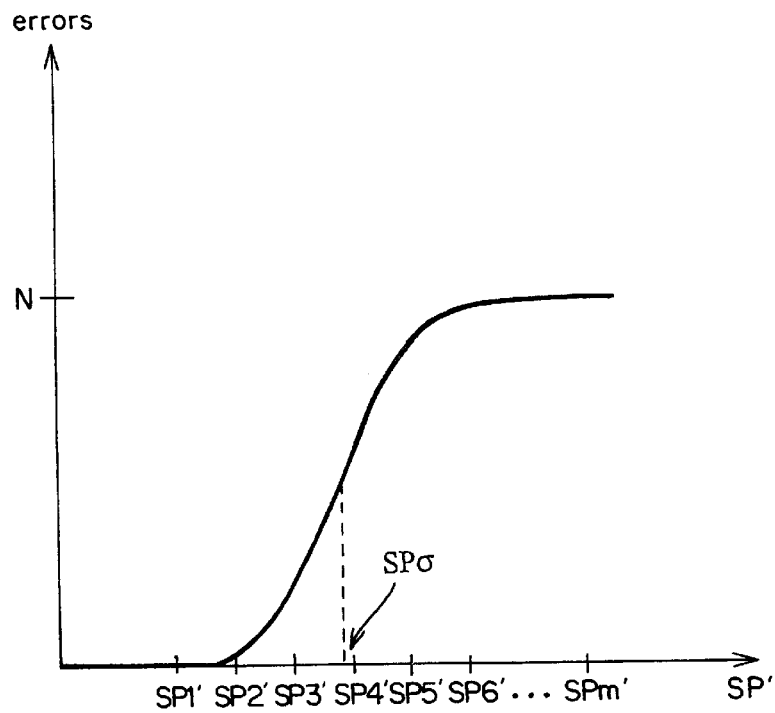
FIG. 4B shows an intermediary curve obtained with the method illustrated in FIG. 4A.

As with the frequency measurement described in relation with FIG. 3A, N samplings of periodic digital signal Sin in N consecutive measurement periods T are successively performed for each measurement time SP1' to SPm'. The measured values are compared with an expected value, for example, zero, and the number of inequations or errors obtained for each measurement time is stored in a table. This number of errors gives an information about the frequency at which signal Sin is at one at the measurement time in each measurement period. If the table thus obtained is represented in the form of a curve of the number of errors against the measurement time, the cumulated distribution law of the position of the edge of periodic digital signal Sin is obtained, as shown in FIG. 4B.

Figure 4C:
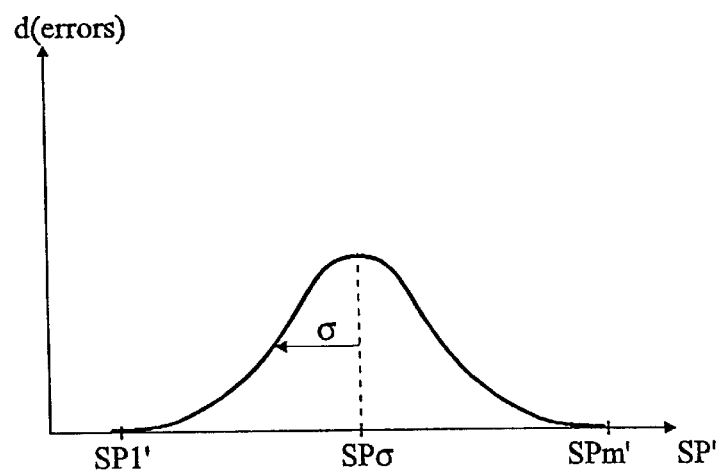
FIG. 4C shows a curve obtained with the method illustrated in FIG. 4A.

The obtained table is transmitted to a calculator which derives it with respect to time. Thus, as shown in FIG. 4C, a curve corresponding to the distribution law of the position of the considered edge of signal Sin is obtained. The calculator determines the standard deviation of this distribution law, which corresponds to jitter a of signal Sin.

If the accuracy of the jitter measurement is desired to be increased, the number N of samplings performed in correspondence with each measurement time is increased.

Figure 5:
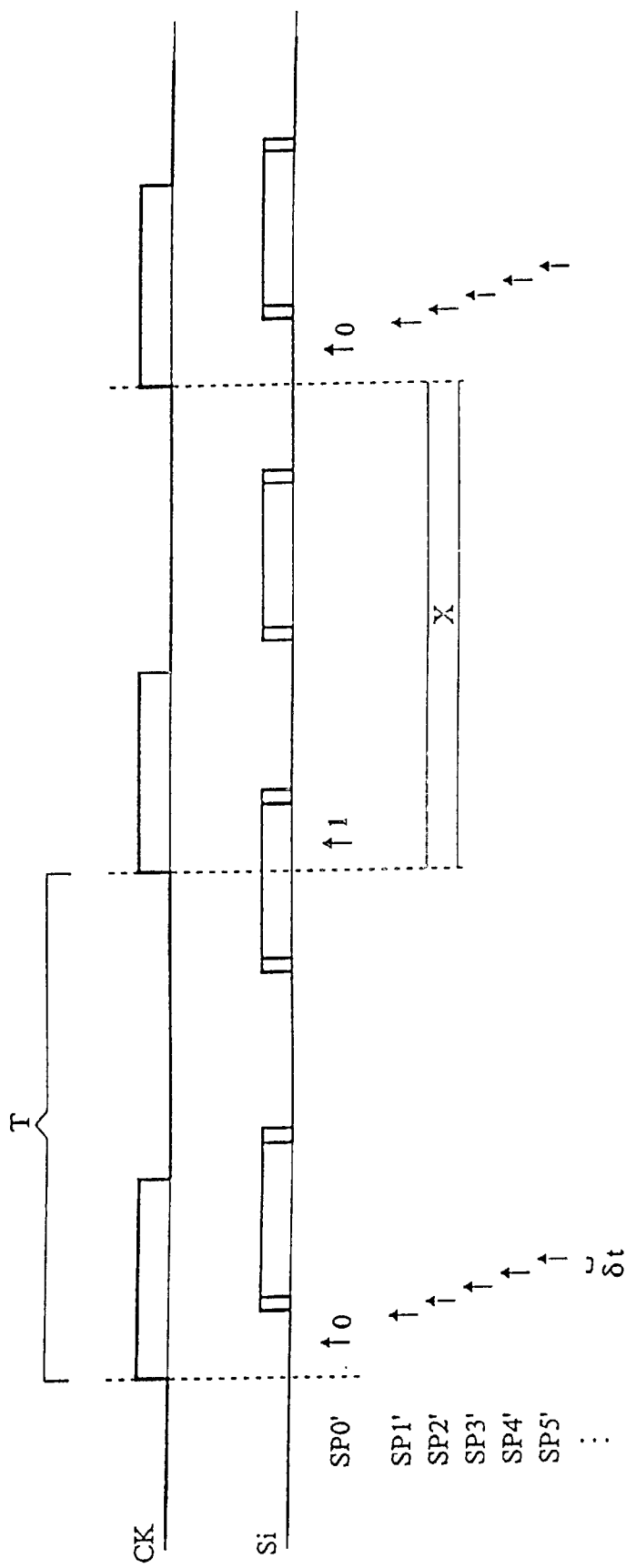
FIG. 5 illustrates a method of measurement of the jitter of a periodic digital signal according to the present invention.

FIG. 5 illustrates a method according to the present invention for determining the jitter of a signal Sin when the ratio of measurement period T of the digital tester and of the period of signal Sin to be analyzed is a non integer ratio of integers.

The phenomenon of phase shift of signal Sin with respect to measurement periods T described in relation with FIG. 2 reappears, and the method described in relation with FIG. 4A is desired to be applied to measurement periods T in which the phase of signal Sin is the same.

To check the phase of signal Sin with respect to each measurement period T, a first measurement time SP0' is set at a point of measurement period T, and a series of measurements of the values of Sin at times SP0' of consecutive periods T is performed. For any measurement period T, the value of the measurement performed at time SP0', as well as of the samples taken at times SP0' of the preceding measurement periods, forms a periodic signature which enables a calculator to determine whether the phase of signal Sin with respect to the considered measurement period T is the expected phase or not.

In FIG. 5, the samples at times SP0' are 010101 . . . , and the periodic signature thus is 01. Only those periods T corresponding to a value 0 will be used to calculate the jitter.

Once it has been determined that the phase of signal Sin is the expected phase, sampling according to the method described in relation with FIG. 4A is performed at measurement times SP1' to SPm'. A table of values corresponding to the cumulated distribution law of the position of the edge of signal Sin to be analyzed in the measurement periods T effectively used is thus obtained. These measurement periods will not be consecutive, but spaced apart by periods T during which the phase of signal Sin is not adequate to perform a sampling.

As according to the method described in relation with FIG. 4A, the table of the errors associated to the measurement times is derived with respect to time by the calculator to obtain the distribution law of the edge of signal Sin in the measurement periods T used. The value of the standard deviation, that is, of the jitter, is then deduced by the calculator based on this law.

Figure 6:
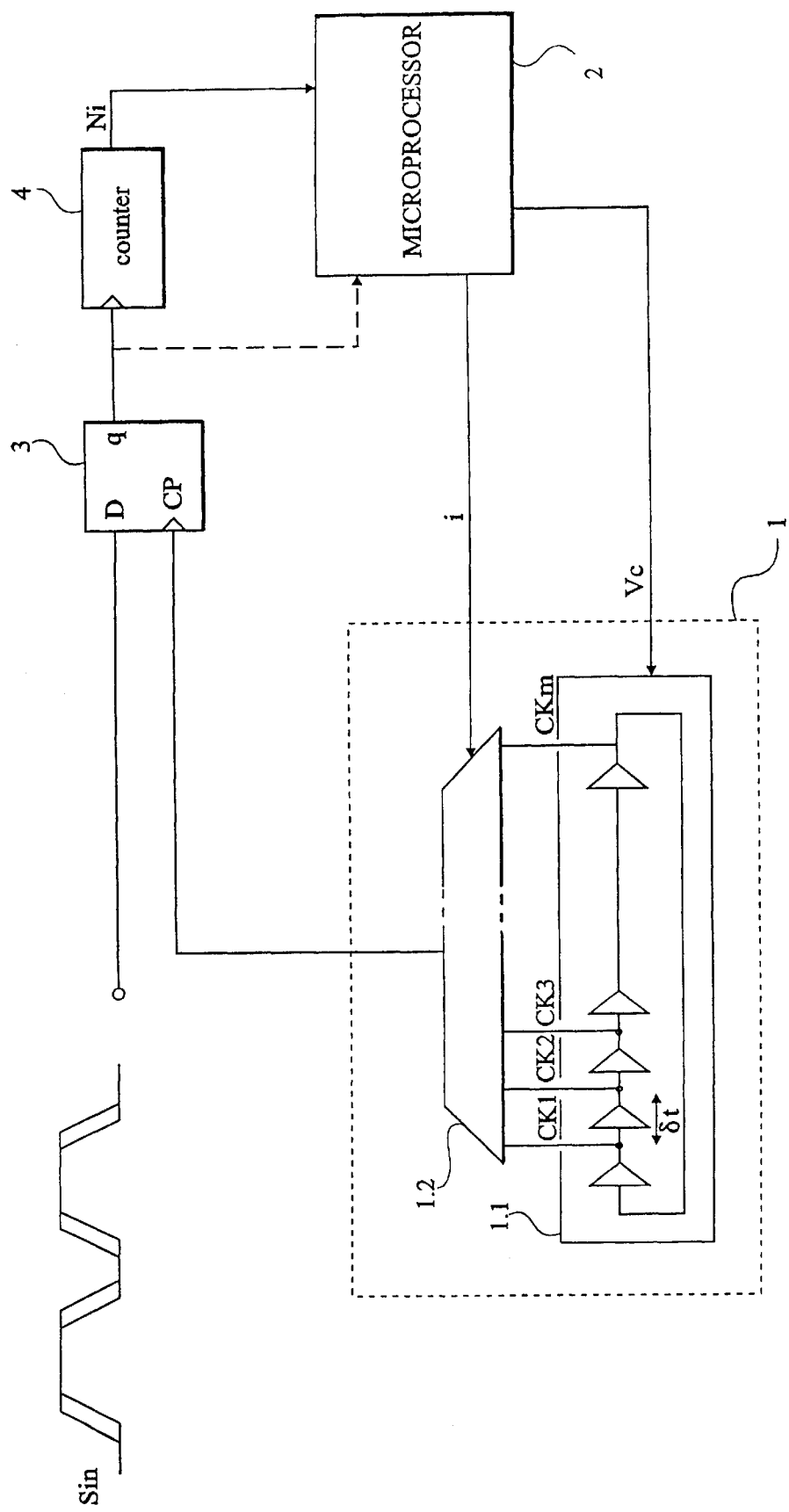
FIG. 6 shows a measurement device for measuring the jitter and frequency of a periodic digital signal according to the present invention.

FIG. 6 shows an embodiment of a device that implements the methods according to the present invention. It is advantageously integrated in a digital circuit. Technological progress more and more frequently enables integrating on the same chip a circuit and its testing device. Such an integrated testing device allows enabling the chip without using an expensive and bulky test machine.

The jitter of a periodic digital signal Sin is desired to be determined. The measurement period as well as the measurement time are determined by means of a device 1 of generation of a sampling clock CKi. Device 1 includes a voltage-controlled oscillator 1.1 generating clock signals CK1 to CKm of same frequency and shifted in phase with respect to each other by a time pitch δt, and a multiplexer 1.2 enabling the supply as a signal CKi of one of signals CK1 to CKm, according to a control signal i generated by a microprocessor 2 (i=1, 2, . . . , m).

Microprocessor 2 provides, via a digital-to-analog converter not shown, control voltage Vc for adjusting period T as well as pitch δt. It also provides signal i. A D-type flip-flop 3 receives on its clock input CP signal CKi and receives on its D input signal Sin. Its Q output is connected to the incrementation input of a counter 4. Output Ni of counter 4 is connected to microprocessor 2.

It is assumed that voltage Vc is determined by microprocessor 2. Thus, the frequency of signal CKi and pitch δt are determined. The choice of measurement time SPi' (described in relation with FIGS. 4A and 5) depends on the position of the edges of signal CKi with respect to the phase of signal Sin, that is, on the value i provided by microprocessor 2: if CK1 corresponds to SP1', CK2 will 45 correspond to SP2', etc. The value is programmed to have i vary from 1 to m, and for each of these values, leave device 1 generate at least N periods of the selected signal CKi.

The Q output of flip-flop 3 corresponds to the samples of signal Sin at the active edges of clock signal CKi, corresponding to measurement times SPi'.

Counter 4 counts, for each measurement time, the number of occurrences at 1 of signal Sin, that is, the number of inequations of the samples with respect to 0, or errors. Microprocessor 2 is associated with a memory, not shown, in which it stores in the form of a table the number of errors Ni measured for each measurement time. Microprocessor 2 determines from this table curves corresponding to those described in relation with FIGS. 4B and 4C, then jitter a.

If the frequency of signal Sin is desired to be measured with this device, microprocessor 2 provides a control voltage Vc such that VCO 1.1 generates sampling signals CK1 to CKm corresponding to measurement times SP1 to SPm described in relation with FIG. 3A, spaced apart by an interval Δt. The microprocessor records from counter 4 the numbers of errors enabling to reconstitute the shape of signal Sin according to FIG. 3B, then to measure its frequency.

If the case described in relation with FIG. 5 is likely to be encountered, a link, shown in dotted lines, is provided between the Q output of flip-flop D3 and microprocessor 2. This would enable the signature search described in relation with FIG. 5.

Of course, the present invention is likely to have various alterations, modifications, and improvements which will readily occur to those skilled in the art. The measurement method described in relation with FIG. 5 could, for example, be adapted, by using a search of the measurement periods for which the phase of analyzed signal Sin is constant, to the frequency measurement method described in relation with FIGS. 3A and 3B in the case where the ratio of the measurement period and of the period of the signal to be analyzed is a non integer ratio of integers. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for determining the jitter of a periodic digital signal, including the steps of:

defining a measurement period such that the ratio between the measurement period and the period of the digital signal is a ratio of integers, selecting a set of measurement periods in which the digital signal substantially has the same phase, defining a measurement time having a same position in each measurement period of the set, storing the value of the digital signal at each measurement time, shifting the measurement time by a predetermined pitch smaller than one measurement period;

repeating the two preceding steps until the measurement time of each measurement period has scanned a predetermined portion of the measurement period in a vicinity of an edge of the digital signal, and comparing the stored values with an expected value, storing in a table the number of inequations resulting from these comparisons for each position of a measurement time, calculating the time derivative of the succession of numbers contained in this table, and using this derivative to calculate the jitter of the digital signal.

2. The method of claim 1, moreover allowing to determine the frequency of the digital signal, the ratio between the measurement period and the period of the digital signal is an integer, the storing of the value of the digital signal and the shifting of the measurement time are repeated until the measurement time of each measurement period has scanned the entire measurement period; and the stored values are compared with an expected value, the number of inequations resulting from these comparisons for each position of a measurement time are stored in a table, and the image of the digital signal provided by this table are used to calculate the period of the digital signal.

3. A device for determining the jitter of a periodic digital signal, including:

means for defining a measurement period such that the ratio between the measurement period and the period of the digital signal is a ratio of integers, means for selecting a set of measurement periods in which the digital signal has substantially the same phase, means for defining a measurement time having a same position in each measurement period of the set, means for storing the value of the digital signal at each measurement time, means for shifting the measurement time by a predetermined pitch smaller than one measurement period;

means for repeating the two preceding steps until the measurement time of each measurement period has scanned a predetermined portion of the measurement period in a vicinity of an edge of the digital signal, and means for comparing the stored values with an expected value, storing in a table the number of inequations resulting from these comparisons for each position of a measurement time, calculating the time derivative of the succession of numbers contained in this table, and using this derivative to calculate the jitter of the digital signal.

* * * * *